(12) United States Patent
Park et al.

(10) Patent No.: US 7,683,489 B2
(45) Date of Patent: Mar. 23, 2010

(54) SEMICONDUCTOR DEVICE AND FABRICATING METHOD THEREOF

(75) Inventors: Kyung Min Park, Namdong-gu (KR); Jae Won Han, Soowon-si (KR)

(73) Assignee: Dongbu Hitek Co., Ltd., Seoul (KR)

( * ) Notice: Subject to any disclaimer, the term of this patent is extended or adjusted under 35 U.S.C. 154(b) by 292 days.

(21) Appl. No.: 11/849,102

(22) Filed: Aug. 31, 2007

(65) Prior Publication Data

US 2008/0054474 A1    Mar. 6, 2008

(30) Foreign Application Priority Data

Aug. 31, 2006    (KR) .................... 10-2006-0083331

(51) Int. Cl.
*H01L 23/48* (2006.01)
(52) U.S. Cl. ................ 257/762; 257/774; 257/E23.145
(58) Field of Classification Search ................ 257/762, 257/774, E23.145; 438/667
See application file for complete search history.

(56) References Cited

U.S. PATENT DOCUMENTS

| | | | | |
|---|---|---|---|---|
| 5,863,307 A | * | 1/1999 | Zhou et al. ..................... | 51/307 |
| 6,017,791 A | * | 1/2000 | Wang et al. .................. | 438/253 |
| 2005/0012126 A1 | * | 1/2005 | Udayakumar et al. ....... | 257/295 |
| 2006/0105573 A1 | * | 5/2006 | Mahalingam et al. ....... | 438/706 |
| 2006/0146233 A1 | * | 7/2006 | Park ........................... | 349/95 |

FOREIGN PATENT DOCUMENTS

| | | |
|---|---|---|
| JP | 2003-415516 | 6/2005 |
| KR | 10-2002-0032360 | 12/2003 |

* cited by examiner

*Primary Examiner*—Trung Dang
(74) *Attorney, Agent, or Firm*—Saliwanchik, Lloyd & Saliwanchik

(57) ABSTRACT

A semiconductor device and a fabricating method thereof are provided. A PMD layer and at least one IMD layer are formed on a semiconductor substrate. A through-electrode penetrates through the PMD layer and the IMD layer, and a connecting electrode connects to the through-electrode.

8 Claims, 3 Drawing Sheets

SEMICONDUCTOR DEVICE AND FABRICATING METHOD THEREOF

CROSS-REFERENCE TO RELATED APPLICATION

The present application claims the benefit under 35 U.S.C. §119 of Korean Patent Application No. 10-2006-0083331, filed Aug. 31, 2006, which is hereby incorporated by reference in its entirety.

BACKGROUND

Semiconductor devices are often fabricated in a SiP (System in a Package).

FIG. 1 shows a semiconductor device in a SiP shape. Ref erring to FIG. 1, the semiconductor device in a SiP shape according to the related art comprises an interposer 11, a first device 13, a second device 15, and a third device 17.

The three devices 13, 15, and 17 can, for example, each be any one of the following group: a central processing unit (CPU), static random access memory (SRAM), dynamic random access memory (DRAM), Flash Memory, Logic large scale integration (LSI), a Power integrated circuit (IC), a Control IC, Analog LSI, mixed mode integrated circuit (MM IC), a complimentary metal oxide semiconductor (CMOS), a radio frequency integrated circuit (RF-IC), a Sensor Chip, or a micro electro mechanical sensor (MEMS) Chip.

Between the first device 13 and the second device 15, and between the second device 15 and the third device 17, a connecting means is typically present for connecting signals between the respective devices.

A through-electrode is a common means for connecting signals between the devices. A through-electrode is an electrode that penetrates through the devices and can electrically connect the corresponding devices and any additional devices on or below those devices.

However, in a SiP semiconductor device, a solder is typically the only method used to electrically connect the devices using a through-electrode. Solder s often have difficulty ensuring bonding stability.

Thus, there exists a need in the art for a stable bonding method to be used with devices in a SiP semiconductor device.

BRIEF SUMMARY

Embodiments of the present invention provide a semiconductor device and a fabricating method capable of easily and stably connecting signals between devices positioned on or below a semiconductor device.

According to an embodiment, a PMD layer and at least one IMD layer are formed on a semiconductor substrate. A through-electrode penetrates through the PMD layer and each IMD layer, and a connecting electrode is formed connected to the through-electrode.

A fabricating method of a semiconductor device can include: forming a PMD layer on a semiconductor substrate; forming at least one IMD layer on the PMD layer; forming a through-electrode penetrating through the PMD layer and each IMD layer; and forming a connecting electrode connected to the through-electrode.

A first device with a first through-electrode penetrating through the device and a first connecting electrode formed connected to the first through-electrode can connect to a second device having a second through-electrode penetrating through the device and a second connecting electrode formed connected to the second through-electrode.

A fabricating method of a semiconductor device according to an embodiment can include: providing a first device with a first through-electrode penetrating through the device and a first connecting electrode formed on the first through-electrode; providing a second device with a second through-electrode penetrating through the device and a second connecting electrode formed under the second through-electrode; and stacking the second device on the first device.

DETAILED DESCRIPTION

When the terms "on" or "over" are used herein, when referring to layers, regions, patterns, or structures, it is understood that the layer, region, pattern or structure can be directly on another layer or structure, or intervening layers, regions, patterns, or structures may also be present. When the terms "under" or "below" are used herein, when referring to layers, regions, patterns, or structures, it is understood that the layer, region, pattern or structure can be directly under the other layer or structure, or intervening layers, regions, patterns, or structures may also be present.

Embodiments of the present invention provide a semiconductor device and a fabricating method thereof capable of easily and stably connecting signals between devices positioned on and below devices of a semiconductor device in SiP form.

Figure 1:
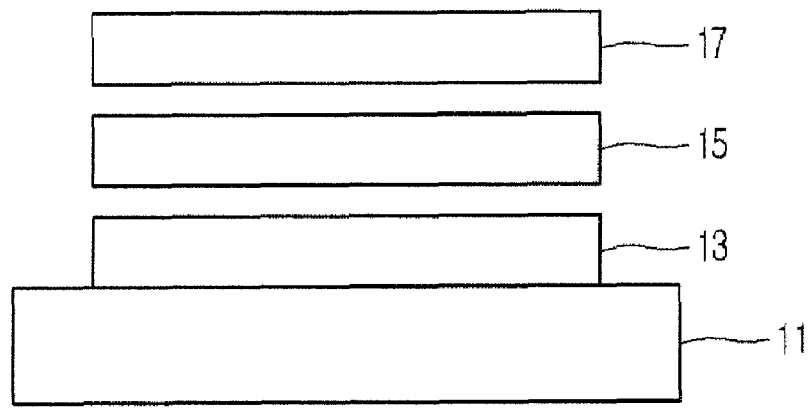
FIG. 1 is a conceptual view showing a system in a package (SiP) semiconductor device in the related art.
Figure 2:
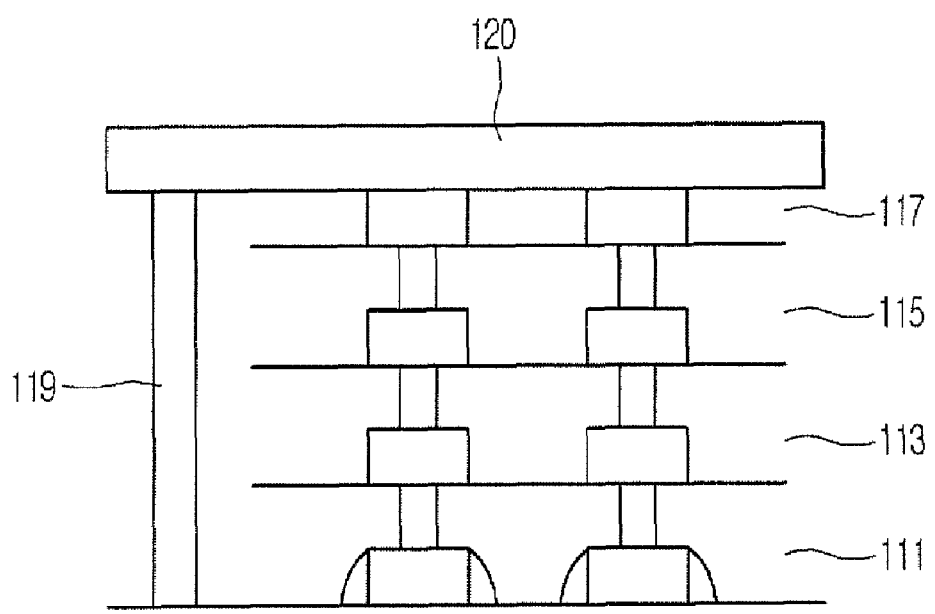
FIGS. 2 and 3 are cross-sectional views showing a method of manufacturing a semiconductor device according to an embodiment of the present invention.
Figure 3:
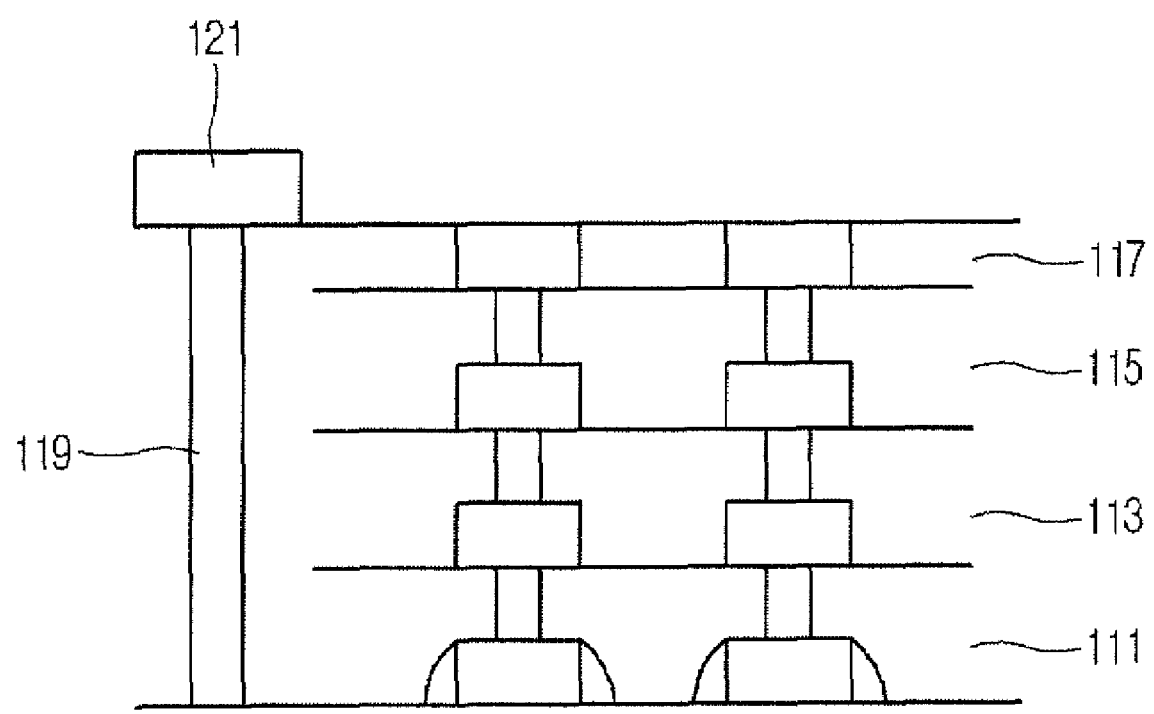

FIGS. 2 and 3 show a fabricating method of a semiconductor device according to an embodiment of the present invention.

Referring to FIG. 2, a pre-metal dielectric (PMD) layer 111 can be formed on a semiconductor substrate (not shown). At least one inter-metal dielectric (IMD) layer can then be formed on the PMD layer 111. In an embodiment, a first, second, and third IMD layer 113, 115, and 117 is each formed on the PMD layer 111. In an alternative embodiment, more than three IMD layers can be formed on the PMD layer 111. In a further alternative embodiment, two IMD layers can be formed on the PMD layer 111. In yet a further embodiment, exactly one IMD layer can be formed on the PMD layer 111.

A through-electrode 119 penetrating through the device can be formed. The through-electrode 119 can be formed by penetrating through the PMD layer 111, and the first, second, and third IMD layers 113, 115, and 117. Also, the through-electrode 119 can be formed by penetrating through the semiconductor device on the PMD layer 111 as needed.

A transistor area can be present on the semiconductor substrate before forming a PMD layer 111.

The through-electrode 119 can be formed to penetrate through the third, second, and first IMD layers 117, 115, and 113 and the PMD layer 111. The through-electrode 119 can be formed up to the boundary surface where the semiconductor substrate is exposed.

The through-electrode 119 can be formed by sequentially performing a pattern process, an etching process, and a metal formation process for each IMD layer (for example, 113, 115, and 117) and the PMD layer 111. The through-electrode 119 can be formed of tungsten (W), copper (Cu), aluminum (Al), silver (Ag), gold (Au), or some combination thereof. The through-electrode 119 can be deposited by chemical vapor deposition (CVD), physical vapor deposition (PVD), Evaporation, electrochemical plating (ECP), or any other appropriate method known in the art. Also, the through-electrode 119 can have a barrier metal formed of TaN, Ta, TiN, Ti, or TiSIN, or any other appropriate material known in the art. The barrier metal of the through-electrode can be formed by CVD, PVD, atomic layer deposition (ALD), or any other appropriate method known in the art.

In an embodiment, the through-electrode 119 can be formed to penetrate through the semiconductor substrate by collectively penetrating through the semiconductor substrate. In an alternative embodiment, the through-electrode 119 can be formed by separately performing an etching process on the semiconductor substrate.

Next, a metal layer 120 can be formed on the through-electrode 119 and the uppermost IMD layer (for example, 117). In an embodiment, a metal layer can be formed under the PMD layer 111 and the through-electrode 119. In a further embodiment, a metal layer can be formed both on and under the device.

Referring to FIG. 3, the metal layer can be patterned to form a connecting electrode 121. The connecting electrode can be formed of, for example, W, Cu, Al, Ag, Au, or any combination thereof. In an embodiment, a connecting electrode can be formed from a metal layer under the PMD layer 111. In a further embodiment, a connecting electrode can be formed from a metal layer both on and under the device. The connecting electrode 121 can be formed on the through-electrode 119 and can electrically connect it to a device on or under it.

A semiconductor device according to an embodiment comprises the through-electrode 119 penetrating through the PMD layer 111 and the first, second, and third IMD layers 113, 115, and 117. Also, the connecting electrode 121 can be formed connected to the through-electrode 119. The connecting electrode 121 can electrically connect the device to another device on or under it.

While FIG. 3 shows the connecting electrode 121 formed on the through-electrode 119, a connecting electrode 121 can be formed under the through-electrode 119, either in addition to or instead of a connecting electrode 121 on the through-electrode 119.

Figure 4:
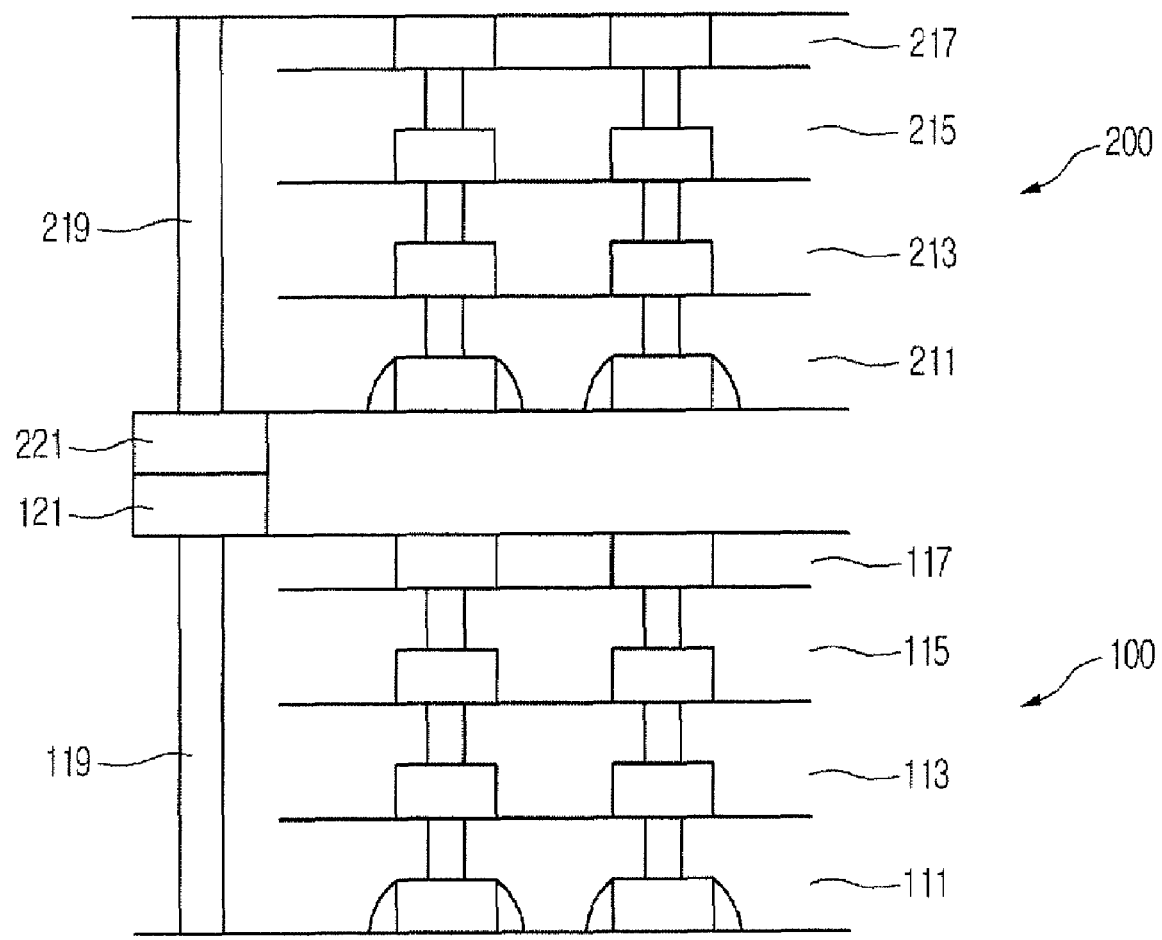
FIG. 4 is a cross-sectional view for showing a semiconductor device according to an embodiment of the present invention.

Referring to FIG. 4, a semiconductor device stacked in SiP form according to an embodiment of the present invention is shown.

A second device 200 can be stacked on a first device 100 in SiP form.

In an embodiment, the first device 100 can include a PMD layer 111 formed on a semiconductor substrate (not shown) and at least one IMD layer (for example, 113, 115, and 117) formed on the PMD layer 111. A through-electrode 119 can penetrate through the PMD layer 111 and the IMD layers (for example, 113, 115, and 117). A connecting electrode 121, which can electrically connect the device 100 to another device (such as device 200), can be formed on the through-electrode 119.

In an embodiment, the second device 200 can include a PMD layer 211 formed on a semiconductor substrate (not shown) and at least one IMD layer formed on the PMD layer 211. Referring to FIG. 4, an embodiment with a first, second, and third IMD layer 213, 215, and 217 are formed is shown. A through-electrode 219 can penetrate through the PMD layer 211 and the IMD layers (for example, 213, 215, and 217). A connecting electrode 221, which can electrically connect the device 200 to another device (such as device 100), can be formed under the through-electrode 219.

In an embodiment, a semiconductor device stacked in SiP form can include the second device 200 stacked on the first device 100 and electrically connected to each other through the connecting electrodes 121 and 221. A fabricating method of the semiconductor device stacked in SiP form helps make it possible to easily and stably form the semiconductor device stacked in SiP form since the devices are connected through the metal connecting electrodes 121 and 221.

The first device and the second device 100 and 200 can each be, for example, any one of the following devices: a CPU, SRAM, DRAM, Flash Memory, Logic LSI, a Power IC, a Control IC, Analog LSI, a MM IC, a CMOS RF-IC, a Sensor Chip, or a MEMS Chip.

With the semiconductor device and the fabricating method thereof, a device can be easily and stably connected to another device on or under it.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A semiconductor device, comprising:
a first device comprising:
a first PMD layer on a first semiconductor substrate;
at least one first IMD layer on the PMD layer;
a first through-electrode penetrating through the first PMD layer and the at least one first IMD layer; and
a first connecting electrode formed on the upper surface of the first through-electrode; and
a second device on the first device and comprising:
a second PMD layer on a second semiconductor substrate;
at least one second IMD layer on the second PMD layer; and
a second through-electrode penetrating through the second PMD layer and the at least one second IMD layer; and
a second connecting electrode formed on the lower surface of the second through-electrode;
wherein the first connecting electrode is electrically connected to the second connecting electrode.

2. The semiconductor device according to claim 1, wherein the second connecting electrode is directly on the first connecting electrode.

3. The semiconductor device according to claim 1, wherein the first device is a device selected from the group consisting of a CPU, SRAM, DRAM, Flash Memory, Logic LSI, a Power IC, a Control IC, Analog LSI, a MM IC, a CMOS RE-IC, a Sensor Chip, and a MEMS Chip.

4. The semiconductor device according to claim 1, wherein the second device is a device selected from the group consisting of a CPU, SRAM, DRAM, Flash Memory, Logic LSI, a Power IC, a Control IC, Analog LSI, a MM IC, a CMOS RF-IC, a Sensor Chip, and a MEMS Chip.

5. The semiconductor device according to claim 1, wherein the first through-electrode comprises at least one material selected from the group consisting of W, Cu, Al, Ag, and Au.

6. The semiconductor device according to claim 1, wherein the first connecting electrode comprises at least one material selected from the group consisting of Al, Cu, and Au.

7. The semiconductor device according to claim 1, wherein the second through-electrode comprises at least one material selected from the group consisting of W, Cu, Al, Ag, and Au.

8. The semiconductor device according to claim 1, wherein the second connecting electrode comprises at least one material selected from the group consisting of Al, Cu, and Au.

* * * * *